United States Patent [19]
Kurahashi et al.

[11] 4,328,262
[45] May 4, 1982

[54] METHOD OF MANUFACTURING SEMICONDUCTOR DEVICES HAVING PHOTORESIST FILM AS A PERMANENT LAYER

[75] Inventors: Toshio Kurahashi, Yokohama; Kazuo Tokitomo, Aizuwakamatsu; Toshihiko Ono, Kawasaki, all of Japan

[73] Assignee: Fujitsu Limited, Kanagawa, Japan

[21] Appl. No.: 172,822

[22] Filed: Jul. 28, 1980

[30] Foreign Application Priority Data

Jul. 31, 1979 [JP] Japan ................................ 54-97656

[51] Int. Cl.³ .................. H01L 21/312; H01L 21/316
[52] U.S. Cl. ...................................... 427/93; 427/82; 427/90; 427/88; 357/54; 430/314
[58] Field of Search ................... 427/82, 84, 87, 88, 427/96, 407.1, 93, 95, 90; 29/588; 430/315, 314; 357/54

[56] References Cited

U.S. PATENT DOCUMENTS

| 3,373,323 | 3/1968 | Wolfrum et al. | 357/14 X |
| 3,602,635 | 8/1971 | Romankiw | 427/96 X |
| 3,903,590 | 9/1975 | Yokogawa | 29/588 X |

Primary Examiner—John D. Smith
Assistant Examiner—Bernard F. Plantz
Attorney, Agent, or Firm—Daniel Jay Tick

[57] ABSTRACT

A layer of aluminum on a semiconductor substrate is covered by a layer of phospho-silicate glass. The surface of the semiconductor chip is covered with a positive photoresist film which is then heat treated. An upper surface of the photoresist film is covered with a polyimide resin which is heat treated, thereafter. If the semiconductor device is devoid of the layer of phospho-silicate glass, and the layer of aluminum is exposed, a positive photoresist film is interposed on the aluminum and the polyimide resin is applied to cover the upper surface of the interlayer, and is heat treated.

12 Claims, 6 Drawing Figures

METHOD OF MANUFACTURING SEMICONDUCTOR DEVICES HAVING PHOTORESIST FILM AS A PERMANENT LAYER

BACKGROUND OF THE INVENTION

The present invention relates to a method of manufacturing semiconductor devices. More particularly the invention relates to a method of covering and protecting a semiconductor chip.

In recent years, resin in the interrelated group of polyimide, hereinafter referred to as polyimide resin has been watched because of its heat resisting nature and utilized in various ways in the manufacture of semiconductor devices. The latest trend is to use polyimide resin even as a covering and protecting film. Its use is for the purpose of protecting the surfaces of semiconductor devices from scratches or damages during or after manufacture thereof. In addition, it has become known that polyimide resin also has the effect of preventing "soft errors" of a semiconductor chip.

By the term "soft errors" is meant extremely vexatious troubles wherein $\alpha$-rays are radiated by radioactive substance contained in the material of an encapsulating package in the order of PPM, or parts per million, resulting in the destruction of memory data.

However, polyimide resin performs poorly in adhesiveness, more so in regard to a film of oxidized silicon. Polyimide resin thus has a weakness that its sealing effect is not sufficient. Because of this, according to the current practice, polyimide resin is coated thin, so that the thickness of its film is approximately 1 $\mu$m, then heat treated and hardened until the film adheres closely. Thereafter, polyimide resin is applied again, so that its film thickness is approximately 20 $\mu$m, for example, then heat treated and hardened. In spite of this, its adhesiveness is not satisfactorily improved.

An object of the invention is to eliminate the defects of the prior and conventional art and to provide a method of manufacture which improves adhesiveness of a surface protection film consisting of a thermosetting resin, especially polyimide resin.

BRIEF SUMMARY OF THE INVENTION

In accordance with the invention, the surface of a semiconductor chip to be heat treated is covered by a photoresist and then a thermosetting resin, especially polyimide resin is applied to cover the upper surface of the photoresist. Heat treatment is provided thereafter.

In accordance with the invention, a method of manufacturing a semiconductor device having a semiconductor substrate, comprises the steps of forming an insulator layer of a material from a group consisting of phospho-silicate glass and silicon oxide on the substrate, covering a surface of the insulator layer with a photoresist film, carrying out a first heat treatment of the substrate to harden the photoresist film, covering an upper surface of the hardened photoresist film with a thermosetting resin film, and carrying out a second heat treatment at a temperature higher than 300° C. to cure the thermosetting resin film.

The photoresist film consists of a positive photoresist compound.

The thermosetting resin film consists of a polyimide compound.

In accordance with the invention, a method of manufacturing a semiconductor device having a semiconductor substrate and a wiring layer of aluminum of the substrate, comprises the steps of forming a photoresist film on the substrate to cover the wiring layer, carrying out a first heat treatment of the substrate to harden the photoresist film, forming a thermosetting resin film on the substrate to cover the photoresist film, partially removing the thermosetting resin film to form an opening at the aluminum wiring layer, and carrying out a second heat treatment to cure the thermosetting resin film.

The second heat treatment is carried out at a temperature higher than 300° C.

The photoresist film consists of a positive photoresist compound.

The thermosetting resin film consists of a polyimide resin compound.

In accordance with the invention, a method of manufacturing a semiconductor device having a semiconductor substrate and a wiring layer formed on the substrate, comprises the steps of forming an insulator layer on the substrate to cover the wiring layer, forming a photoresist film on the substrate to cover the insulator layer, carrying out a first heat treatment of the substrate to harden the photoresist film, forming an opening in the photoresist film at a part of the wiring layer, etching of the insulator layer to form an opening at the wiring layer, forming a thermosetting resin film on the substrate to cover the photoresist film, partially removing the thermosetting resin film to form an opening at the wiring layer, and carrying out a second heat treatment to cure the thermosetting resin film whereby the thermosetting resin film serves as a protective film of the device.

The insulator film consists of phospho-silicate glass.

The second heat treatment is carried out at a temperature higher than 300° C.

The photoresist film consists of a positive photoresist compound.

The thermosetting resin consists of a polyimide resin compound.

BRIEF DESCRIPTION OF THE FIGURES

In order that the invention may be readily carried into effect, it will now be described with reference to the accompanying drawings, wherein.

DETAILED DESCRIPTION OF THE PREFERRED EMBODIMENTS OF THE INVENTION

Figure 1:
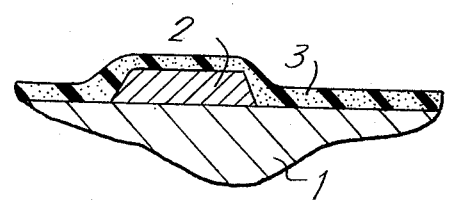
FIGS. 1 to 6 are cross-sectional views illustrating successive steps of the method of manufacturing semiconductor devices of the invention.

FIGS. 1 to 6 illustrate successive steps of an embodiment of the method of the invention FIG. 1 shows a step wherein a wiring conductor layer 2 of aluminum, formed in accordance with a circuit pattern on a semiconductor substrate 1, is covered with an insulator layer 3 which typically consists of phospho-silicate glass, or PSG. The insulator layer 3 is formed on the substrate by chemical vapor deposition, or CVD, covering the upper surface of the conductor layer 2.

Figure 2:
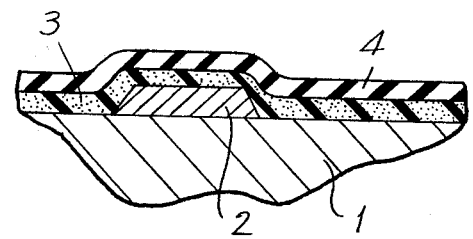

Next, as shown in FIG. 2, a positive photoresist is applied by a spin coating technique using a conventional spinner to form a film 4 on the substrate. The photoresist film 4 is then baked or heat treated at a temperature within the range of 100° to 120° C. to harden the film. The thickness of the photoresist film varies depending upon the surface condition of the PSG layer, but a thickness between 7000 A. and 3 μm has been found to be appropriate. The photoresist film 4 is formed to cover the conductor layer 2 or the insulator layer 3.

Well known positive photoresist compounds consisting of substituted O-naphthoquinonediazides as photoactive compounds mixed with Novolak-type resins may be used in this embodiment. Such photoresist compounds are disclosed in detail in a technical paper entitled "Photochemical Decomposition Mechanism for AZ-Type Photoresists" by J. Pacansky et al., IBM Journal of Research and Development, Vol. 23, No. 1, January 1979, pages 42 to 55. Negative photoresists also may be used as the film 4 in the method of the invention. For this purpose, negative photoresist compounds known in the art, such as ciclized polyisoprene having an average molecular weight of 60,000 to 70,000 before the coating process mixed with a cross-linking agent of 2-6-4-bisazidebenzalmethylcyclohexane, may be used. This negative photoresist compound generally developes an average molecular weight of more than 100,000 after the baking process at 150° C., for example; the baking being carried out before the exposure process.

Figure 3:
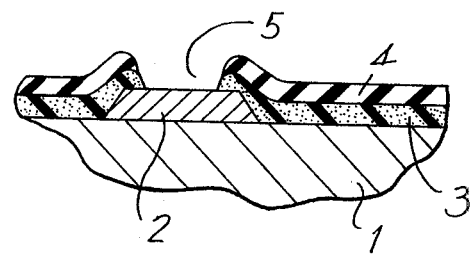

Then, as illustrated in FIG. 3, the photoresist film 4 is exposed to ultraviolet light through a mask, and then patterned to form an opening 5 at a part on the PSG layer for a terminal pad by a conventional development technique. The openings 5 are formed at parts of the aluminum layer 2 where terminal pads for connecting lead wires, or contact windows for connecting first and second aluminum wiring layers with each other, are to be formed. Thereafter, the part of PSG layer exposed by the opening in the photoresist film 4 functioning as mask is removed to provide an opening 5 at the wiring layer 2 by etching. Heat treatment of the substrate at a high temperature of more than 300° C., such as, for example, 450° C., is then carried out in an inert ambience of nitrogen gas for more than 10 minutes. Through such process, the positive photoresist film 4 becomes thermally stable.

Figure 4:
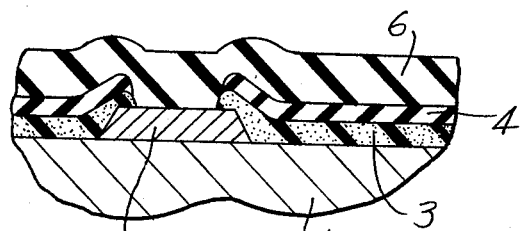

Thereafter, as shown in FIG. 4, polyimide resin film 6 is applied by a spin coating technique using a conventional spinner and then heat treated at a temperature of approximately 200° C. to harden said polyimide resin film. The thickness of the polyimide resin film 6 is between 10 and 20 μm.

The polyimide resin used in this embodiment is well known in the art and has a basic molecular structure represented by the following chemical formula

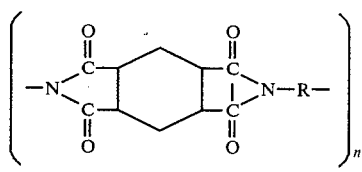

in which R represents alkylene radicals having 1 to 3 carbon atoms, diphenylether radicals, or phenylene radicals. methyl-2-pyrrolidone or N dimethyl acetamide my be used as a solvent of the polyimide resin to prepare a polyimide resin solution for the spin coating process. Polyimide resin compounds disclosed in Japanese patent publications, Tokkosho 48-2957 and 48-2958, are also preferable for use in the method of the invention.

Other thermosetting resin compounds such as aromatic polyamide compounds having the following basic molecular structure

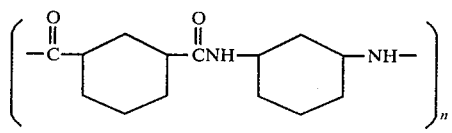

or aromatic polyester compounds having the following basic molecular structure

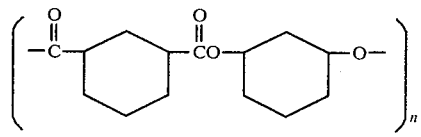

or ladder type organo-polysiloxane compounds having the following molecular formula

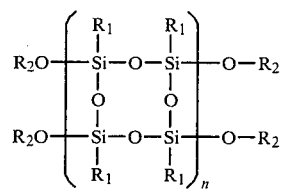

or poly simple organo siloxane compounds having the following chemical formula

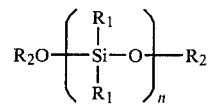

in which $R_1$ represents methyl or phenyl radicals and $R_2$ represents hydroxy or ethoxy radicals, may be used as the polyimide resin protective film 6.

Figure 5:
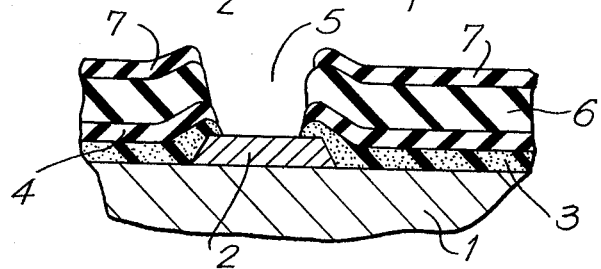

The next step of the method of the invention is, as shown in FIG. 5, to apply negative photoresist film 7 to the polyimide resin film 6 and to provide patterning in order to partially remove polyimide resin to form the opening 5 for a terminal pad or a contact window. The window is opened by etching with an etchant of polyimide resin in liquid form.

Figure 6:
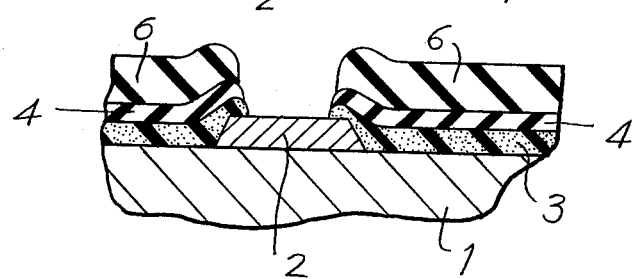

As illustrated in FIG. 6, the negative photoresist film 7 is then removed by a suitable organic solvent. Heat treatment is again undertaken at a high temperature of 450° C. in order to cure the polyimide resin 6. This results in stabilization of the polyimide resin 6 at high temperatures.

In another embodiment, where there is no PSG layer on the conductor layer of aluminum, so that the aluminum conductor layer is exposed entirely, it is possible to interpose the positive photoresist film as an interlayer, apply the polyimide resin thereon and carry out the heat treatment in the same manner as hereinbefore described before to provide a protective layer.

In the foregoing embodiments, the heat treatment of the polyimide resin at a temperature of 450° C. is undertaken in view of the chip bonding operation, involving a high temperature of about 450° C., performed subsequently. Therefore, although it is not intended to limit such temperature to 450° C., heat treatment at a temperature higher than 300° C. should be undertaken in any case to cure the thermosetting resin for the protective film.

As described, when the thermosetting resin film for the protective layer is formed, a photoresist film is formed thereunder, and thermal stability is attained by heat treatment at a high temperature. The photoresist film, having satisfactory adherence characteristics, therefore serves the purpose of improving adherence between the film of silicon oxide, the PSG layer or the layer of metal, such as aluminum, on the surface of the semiconductor substrate and the polyimide resin film.

Furthermore, in the manufacturing steps of semiconductor devices, a completed semiconductor chip is obtained by dicing the substrate and placing it in a suitable encapusulated package. After the wire bonding operation is completed, a thermosetting resin, especially polyimide resin, may be used to cover the entire surface of the semiconductor chip, or a polyimide resin film may be interposed between the multiple conductor layers as an insulation layer. In either case, adherence characteristics may be substantially improved by utilizing the photoresist film.

Therefore, according to the present invention, it is possible to cause thermosetting resin film adhere sufficiently to a desired surface in order to protect the semiconductor device against surface scratches or soft errors. This has a remarkable effect of increasing the reliability of the semiconductor devices.

While the invention has been described by means of a specific example and in a specific embodiment, we do not wish to be limited thereto, for obvious modifications will occur to those skilled in the art without departing from the spirit and scope of the invention.

We claim:

1. A method of manufacturing a semiconductor device having a semiconductor substrate, said method comprising the steps of
    forming an insulator layer of a material from a group consisting of phospho-silicate glass and silicon oxide on the substrate;
    covering a surface of the insulator layer with a photoresist film;
    carrying out a first heat treatment of said substrate to harden the photoresist film;
    covering an upper surface of the hardened photoresist film with a thermosetting resin film; and
    carrying out a second heat treatment at a temperature higher than 300° C. to cure the thermosetting resin film.

2. A method as claimed in claim 1, wherein said photoresist film consists of a positive photoresist compound.

3. A method as claimed in claim 1, wherein said thermosetting resin film consists of a polyimide compound.

4. A method of manufacturing a semiconductor device having a semiconductor substrate and a wiring layer of aluminum on the substrate, said method comprising the steps of
    forming a photoresist film on the substrate to cover the wiring layer;
    carrying out a first heat treatment of said substrate to harden the photoresist film;
    forming a thermosetting resin film on said substrate to cover said photoresist film;
    partially removing the thermosetting resin film to form an opening at the aluminum wiring layer; and
    carrying out a second heat treatment to cure said thermosetting resin film.

5. A method as claimed in claim 4, wherein the second heat treatment is carried out at a temperature higher than 300° C.

6. A method as claimed in claim 4, wherein said photoresist film consists of a positive photoresist compound.

7. A method as claimed in claim 4, wherein said thermosetting resin film consists of a polyimide resin compound.

8. A method of manufacturing a semiconductor device having a semiconductor substrate and a wiring layer formed on the substrate, said method comprising the steps of
    forming an insulator layer on the substrate to cover the wiring layer;
    forming a photoresist film on said substrate to cover the insulator layer;
    carrying out a first heat treatment of said substrate to harden the photoresist film;
    forming an opening in said photoresist film at a part of the wiring layer;
    etching of said insulator layer to form an opening at the wiring layer;
    forming a thermosetting resin film on said substrate to cover said photoresist film;
    partially removing the thermosetting resin film to form an opening at the wiring layer; and
    carrying out a second heat treatment to cure said thermosetting resin film whereby said thermosetting resin film serves as a protective film of the device.

9. A method as claimed in claim 8, wherein said insulator film consists of phospho-silicate glass.

10. A method as claimed in claim 8, wherein the second heat treatment is carried out at a temperature higher than 300° C.

11. A method as claimed in claim 8, wherein said photoresist film consists of a positive photoresist compound.

12. A method as claimed in claim 8, wherein said thermosetting resin consists of a polyimide resin compound.

* * * * *